United States Patent
Chambers et al.

(10) Patent No.: US 11,856,356 B2
(45) Date of Patent: Dec. 26, 2023

(54) OPEN-EAR HEADPHONE

(71) Applicant: Bose Corporation, Framingham, MA (US)

(72) Inventors: Thomas Chambers, Bellingham, MA (US); Caitlin Hanson, Westborough, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 17/587,761

(22) Filed: Jan. 28, 2022

(65) Prior Publication Data

US 2023/0247343 A1    Aug. 3, 2023

(51) Int. Cl.
*H04R 1/10*    (2006.01)

(52) U.S. Cl.
CPC ......... *H04R 1/1058* (2013.01); *H04R 1/1016* (2013.01); *H04R 1/1025* (2013.01); *H04R 1/1041* (2013.01); *H04R 2460/09* (2013.01)

(58) Field of Classification Search
CPC .... H04R 1/105; H04R 1/1058; H04R 1/1066; H04R 1/1016; H04R 1/1025; H04R 1/1041; H04R 2460/09; H05K 1/189; H05K 1/028; H05K 1/118; H05K 1/148; H05K 2201/05; H05K 2201/055

See application file for complete search history.

(56) References Cited

U.S. PATENT DOCUMENTS

| | | |
|---|---|---|
| 5,204,917 A | 4/1993 | Arndt |
| 11,140,469 B1 | 10/2021 | Miller et al. |
| 2015/0289364 A1* | 10/2015 | Ilkko ................ H05K 1/0283 174/254 |
| 2016/0020500 A1* | 1/2016 | Matsuda ............ H01P 3/085 333/238 |
| 2018/0070179 A1* | 3/2018 | McAuliffe ......... H05K 1/028 |
| 2018/0109868 A1* | 4/2018 | Roed .................. H04R 1/083 |
| 2021/0067862 A1 | 3/2021 | Yongjan et al. |
| 2023/0028541 A1* | 1/2023 | Wang ................. H04R 1/1091 |

OTHER PUBLICATIONS

International Search Report and Written Opinion, dated May 22, 2023 in related PCT/US2023/011716.

* cited by examiner

*Primary Examiner* — Jason R Kurr
(74) *Attorney, Agent, or Firm* — BOSE CORPORATION

(57) ABSTRACT

A flexible arm that is configured to be located between and physically and electrically connect an acoustic module of an open-ear headphone to a battery housing of the open-ear headphone. The flexible arm defines an original resting length and position between the acoustic module and the battery housing. The flexible arm includes a flexible printed circuit that extends through the entire original resting length of the flexible arm and comprises a conductor that is configured to carry electrical energy between the acoustic module and the battery housing, and a flexible material that encases at least some of the flexible printed circuit. The length of the flexible printed circuit within the flexible arm is greater than the original resting length of the flexible arm. The flexible printed circuit can thus better accommodate tension or compression on the flexible arm as the flexible arm is bent from its original resting position.

20 Claims, 4 Drawing Sheets

OPEN-EAR HEADPHONE

BACKGROUND

This disclosure relates to a headphone that is carried on the ear.

Open-ear headphones typically emit sound close to but not in the ear canal.

SUMMARY

Aspects and examples are directed to an open-ear headphone with an acoustic module that is configured to be located in the concha of the outer ear of the user. In some examples the acoustic module is configured to be located in the cavum conchae. The acoustic module includes a housing that contains an acoustic transducer. There is a sound-emitting opening in the housing that is configured to emit sound produced by the acoustic transducer. The sound-emitting opening is configured to be located close to the ear canal opening when the acoustic module is in place in the concha. The headphone also includes a battery housing that is configured to be located behind the ear, and a flexible arm that is located between and physically and electrically connects the acoustic module and the battery housing. The flexible arm defines an original resting length and position between the acoustic module and the battery housing. The flexible arm includes a flexible printed circuit that extends through the entire original resting length of the flexible arm and comprises a conductor that is configured to carry electrical energy between the acoustic module and the battery housing. A flexible material encases at least some of the flexible printed circuit. The length of the flexible printed circuit within the flexible arm is greater than the original resting length of the flexible arm. The extra length of the flexible printed circuit in the arm allows the flexible printed circuit to better accommodate tension or compression on the flexible arm as the flexible arm is bent from its original resting position.

All examples and features mentioned below can be combined in any technically possible way.

In one aspect, a flexible arm that is configured to be located between and physically and electrically connect an acoustic module of an open-ear headphone to a battery housing of the open-ear headphone, wherein the flexible arm defines an original resting length and position between the acoustic module and the battery housing, includes a flexible printed circuit that extends through the entire original resting length of the flexible arm and comprises a conductor that is configured to carry electrical energy between the acoustic module and the battery housing, and a flexible material that encases at least some of the flexible printed circuit. The length of the flexible printed circuit within the flexible arm is greater than the original resting length of the flexible arm. The flexible printed circuit can thus better accommodate tension or compression on the flexible arm as the flexible arm is bent from its original resting position.

Some examples include one of the above and/or below features, or any combination thereof. In an example the flexible printed circuit defines at least one simple open curve along its length within the flexible arm. In an example the flexible printed circuit defines a plurality of both simple open upward curves and simple open downward curves along its length within the flexible arm. In an example each simple open downward curve of the flexible printed circuit is adjacent to one more of the simple open upward curves. In some examples the original resting position of the flexible arm lies along a curved axis. In an example the curved axis of the flexible arm defines a simple open curve. In an example the curved axis is generally "C"-shaped. In an example the curved axis bisects the flexible arm, and different parts of a first surface of the flexible printed circuit lie on different sides of the curved axis.

Some examples include one of the above and/or below features, or any combination thereof. In some examples the flexible material comprises two mating members that each define a series of simple open curves along the original resting length of the flexible arm. In an example the simple open curves of the two mating members are complimentary. In an example the two mating members each define a wave-shaped mating surface wherein convex portions of one member are aligned with and fit into concave portions of the other member, and the flexible printed circuit is located between the mating surfaces of the two mating members. In an example the flexible arm also includes an over-mold that encircles the flexible material along at least most of the original resting length of the flexible arm. In an example the over-mold further covers at least some of the battery housing.

Some examples include one of the above and/or below features, or any combination thereof. In some examples the flexible printed circuit defines one or more open curves along its length within the flexible arm. In an example the one or more open curves are simple open curves. In an example the flexible arm also includes a flexible printed circuit stress relief member proximate the flexible material. The stress relief member defines an opening through which the flexible printed circuit is threaded. In an example the flexible printed circuit defines an open slot along a portion of its length in the flexible arm, to accommodate twisting of the flexible printed circuit about its length.

In another aspect, a flexible arm that is configured to be located between and physically and electrically connect an acoustic module of an open-ear headphone to a battery housing of the open-ear headphone, wherein the flexible arm defines an original resting length and position between the acoustic module and the battery housing, wherein the original resting position of the flexible arm lies along a generally "C"-shaped curved axis, includes a flexible printed circuit that extends through the entire original resting length of the flexible arm and comprises a conductor that is configured to carry electrical energy between the acoustic module and the battery housing, and a flexible material that encases at least some of the flexible printed circuit. The flexible printed circuit defines at least one simple open curve along a length of the flexible printed circuit within the flexible arm, such that its length within the flexible arm is greater than the original resting length of the flexible arm. This allows the flexible printed circuit to better accommodate tension or compression on the flexible arm as the flexible arm is bent from its original resting position.

Some examples include one of the above and/or below features, or any combination thereof. In an example the flexible printed circuit defines a plurality of both simple open upward curves and simple open downward curves along its length within the flexible arm, and each simple open downward curve of the flexible printed circuit is adjacent to a simple open upward curve. In an example the flexible arm also includes a flexible printed circuit stress relief member proximate the flexible material. The stress relief member defines an opening through which the flexible printed circuit is threaded.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the inventions. In the figures, identical or nearly identical components illustrated in various figures may be represented by a like reference character or numeral. For purposes of clarity, not every component may be labeled in every figure. In the figures.

DETAILED DESCRIPTION

Figure 1:
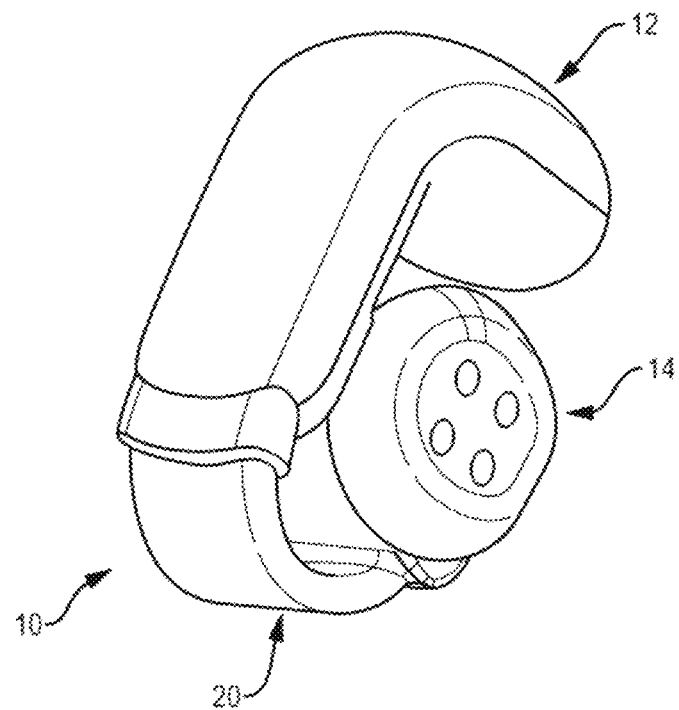
FIG. 1 is a perspective view of an open-ear headphone.

Open-ear headphones that are carried on the ear should provide high-quality sound, be stable on the ear, be comfortable to wear for long periods of time, be unobtrusive, and look stylish. These goals can be difficult to achieve, as in some respects they have been considered mutually exclusive. For example, stability typically translates into clamping on the outer ear, which can be uncomfortable for long-term wear and also may not look stylish. Also, for high-quality sound there must be sound delivery close to but not in the ear canal, meaning that headphone structure needs to overlie the ear and so may be highly visible to others. Also, for the best sound quality the sound should be delivered close to but not in the ear canal opening.

Examples of the open-ear headphones discussed herein are not limited in application to the details of construction and the arrangement of components set forth in the following description or illustrated in the accompanying drawings. The headphones are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

Also, the phraseology and terminology used herein is for the purpose of description and should not be regarded as limiting. Any references to examples, components, elements, acts, or functions of the headphones herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

In some examples herein the open-ear headphone includes a flexible arm that is configured to be located between and physically and electrically connect the acoustic module and the battery housing. The flexible arm defines an original resting length and position between the acoustic module and the battery housing. The flexible arm includes a flexible printed circuit that extends through the entire original resting length of the flexible arm. The flexible printed circuit includes one or more conductors that carry electrical energy between the acoustic module and the battery housing. A flexible material encases at least some of the flexible printed circuit. The length of the flexible printed circuit within the flexible arm is greater than the original resting length of the flexible arm. The flexible printed circuit can thus better accommodate tension or compression on the flexible arm as the flexible arm is bent from its original resting position.

In some examples the original resting position of the flexible arm lies along a curved axis. In an example the curved axis defines a simple open curve. In an example the curved axis is generally "C"-shaped. In an example the curved axis bisects the flexible arm, and different parts of a first surface of the flexible printed circuit lie on different sides of the curved axis. In an example the flexible printed circuit defines at least one simple open curve along its length within the flexible arm. In an example the flexible printed circuit defines a plurality of both simple open upward curves and simple open downward curves along its length within the flexible arm. In an example each simple open downward curve is adjacent to one more of the simple open upward curves.

In some examples the flexible material includes two mating members that each define a series of simple open curves along the original resting length of the flexible arm. In an example the simple open curves of the two mating members are complimentary. In an example the two mating members each define a wave-shaped mating surface wherein convex portions of one member are aligned with and fit into concave portions of the other member, and the flexible printed circuit is located between the mating surfaces of the two mating members. In an example the flexible arm also includes an over-mold that encircles the flexible material along at least most and preferably all of the original resting length of the flexible arm. In an example the over-mold further covers at least some and preferably all of the battery housing.

In some examples the flexible printed circuit defines one or more open curves along its length within the flexible arm. In an example the one or more open curves are simple open curves. In an example the flexible arm also includes a flexible printed circuit stress relief member proximate the flexible material. The stress relief member defines an opening through which the flexible printed circuit is threaded. In an example the flexible printed circuit defines an open slot along a portion of its length in the flexible arm, to accommodate twisting of the flexible printed circuit about its length.

In other examples herein the open-ear headphone includes a flexible arm that is located between and physically and electrically connects the acoustic module to the battery housing. The flexible arm defines an original resting length and position between the acoustic module and the battery housing. The original resting position of the flexible arm lies along a generally "C"-shaped curved axis. The arm includes a flexible printed circuit that extends through the entire original resting length of the arm. The flexible printed circuit includes one or more conductors that carry electrical energy between the acoustic module and the battery housing. A flexible material encases at least some of the flexible printed circuit. The flexible printed circuit defines at least one simple open curve along its length within the flexible arm, such that its length within the flexible arm is greater than the original resting length of the flexible arm. This allows the flexible printed circuit to better accommodate tension or compression on the flexible arm as the flexible arm is bent from its original resting position.

In an example the flexible printed circuit defines a plurality of both simple open upward curves and simple open downward curves along its length within the flexible arm, and each simple open downward curve is adjacent to a simple open upward curve. In an example the flexible arm also includes a flexible printed circuit stress relief member proximate the flexible material. The stress relief member defines an opening through which the flexible printed circuit is threaded.

FIG. 1 is a perspective view of open-ear headphone 10. Headphone 10 is configured to be carried on an ear of a user such that its acoustic module 12 is located in the concha of the ear and battery housing 14 is located behind the ear. Flexible arm 20 is configured to pass over the outer side of the helix, anti-helix and/or lobule of the ear. Arm 20 has an original or resting position and length, illustrated in FIG. 1. In some examples the original position generally defines a "C"-shape, as shown in FIG. 1. Arm 20 is configured to be flexed at least along its length, so that the space between acoustic module 12 and battery housing 14 can be slightly increased. This allows headphone 10 to be donned and doffed from the ear without needing to push the headphone over the external ear, yet still provides a light clamping force on the ear to help keep headphone 10 in place on the ear as the user's head moves. Electrical signals need to be carried through arm 20. In some examples the electrical signals include the power from the battery (not shown) in battery housing 14 to the acoustic transducer (not shown) in acoustic module 12, and audio signals from wireless reception and processing circuitry (not shown) that can be located in one or both of arm 20 and battery housing 14. In some examples these electrical signals are carried by conductors of a flexible printed circuit. The flexible printed circuit needs to be able to flex as arm 20 is flexed, yet at the same time needs to carry necessary electrical signals. Flexible printed circuits are well known in the electrical/electronics fields and so are not further described herein.

Additional details of an open-ear headphone, including but not limited to its construction, operation, and details of its acoustic performance, are disclosed in U.S. Pat. No. 11,140,469, the entire disclosure of which is incorporated herein by reference and for all purposes. Aspects of the present open-ear headphone that are disclosed in this patent are not further described herein.

Figure 2A:
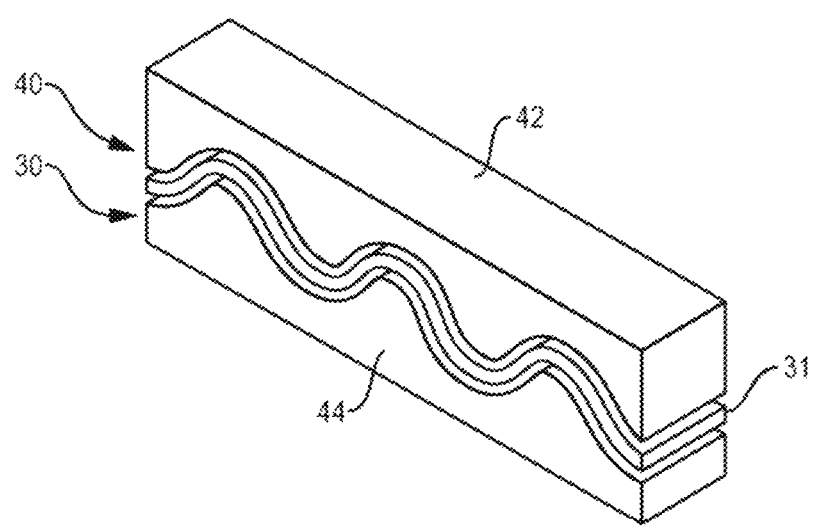
FIGS. 2A and 2B are perspective and side exploded views, respectively, of part of a flexible arm for an open-ear headphone.
Figure 2B:
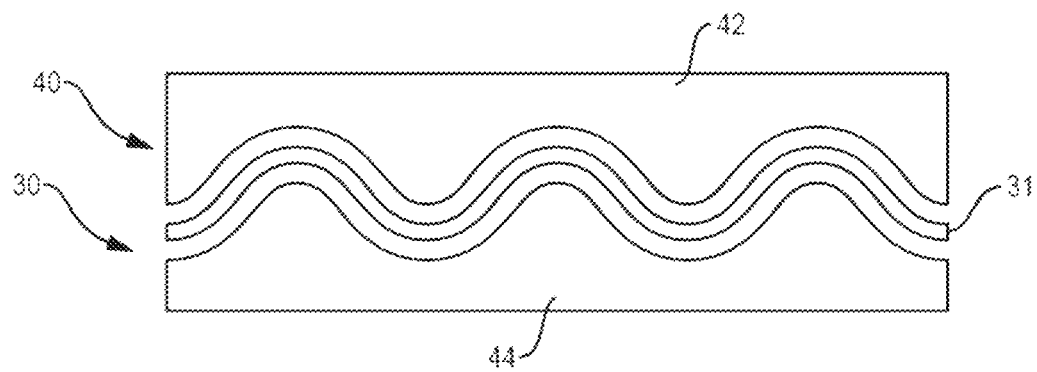

FIGS. 2A and 2B are perspective and side exploded views of portion 30 of a flexible arm for an open-ear headphone. Portion 30 includes flexible printed circuit 31 which itself includes one or more conductors (not shown). In some examples flexible printed circuit 31 extends through the entire original resting length of the flexible arm in which it is used. Flexible material 40 encases at least some of flexible printed circuit 31. In this example flexible material 40 comprises separate mating portions 42 and 44. In some examples portions 42 and 44 are made from a compliant material such as silicone. To accommodate flexing of the arm in which portion 30 is used, the length of the flexible printed circuit within the flexible arm is greater than the original resting length of the flexible arm, such that the flexible printed circuit can better accommodate tension or compression on the flexible arm as the flexible arm is bent from its original resting position. In this example, portions 42 and 44 each define a series of alternating concave and convex portions that are configured to mate when portions 42 and 44 are assembled together, as depicted in FIG. 2C.

Figure 2C:
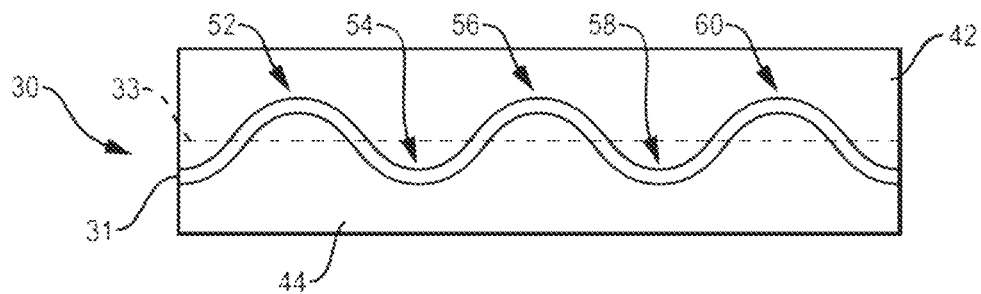
FIG. 2C is an assembled view of the partial flexible arm of FIGS. 2A and 2B.

FIG. 2C is an assembled view of the partial flexible arm of FIGS. 2A and 2B. A result is a wave or general sinusoid shape imparted on the flexible printed circuit. In this example convex and concave adjacent simple open curves 52, 54, 56, 58, and 60 are imparted on flexible printed circuit 31. These curves partially lie on both sides of arm central longitudinal axis 33. One or more curves accomplish a conductor length that is longer than the original resting length of the flexible arm in which portion 30 is used. If the arm is bent, the extra length will accommodate the bending with less stress on or bending of the conductors of the flexible printed circuit. Since the conductors of the flexible printed circuit are generally metal (e.g., copper traces) that can be fatigued and may break when flexed or bent, the additional length helps the flexible printed circuit to survive repeated donning and doffing of the open-ear headphone.

In examples herein the longer length of flexible printed circuit 31 is accomplished by configuring it such that defines one or more open curves along its length within the flexible arm. In some examples the one or more open curves are simple open curves. In some examples the original resting position of the flexible arm lies along a curved axis and the flexible printed circuit defines at least one simple open curve along its length within the flexible arm. In some examples the curved axis of the arm defines a simple open curve. In an example the curved axis is generally "C"-shaped. In an example the curved axis bisects the flexible arm, and different parts of a first surface of the flexible printed circuit (e.g., the top or bottom surface) lie on different sides of the curved axis. In an example the flexible printed circuit defines a plurality of both simple open upward curves and simple open downward curves along its length within the flexible arm. In an example each simple open downward curve of the flexible printed circuit is adjacent to one more of the simple open upward curves.

In some examples the flexible material comprises two mating members that each define a series of simple open curves along the original resting length of the flexible arm. In an example the simple open curves of the two mating members are complimentary. In an example the two mating members each define a wave-shaped mating surface wherein convex portions of one member are aligned with and fit into concave portions of the other member, and wherein the flexible printed circuit is located between the mating surfaces of the two mating members.

Figure 2D:
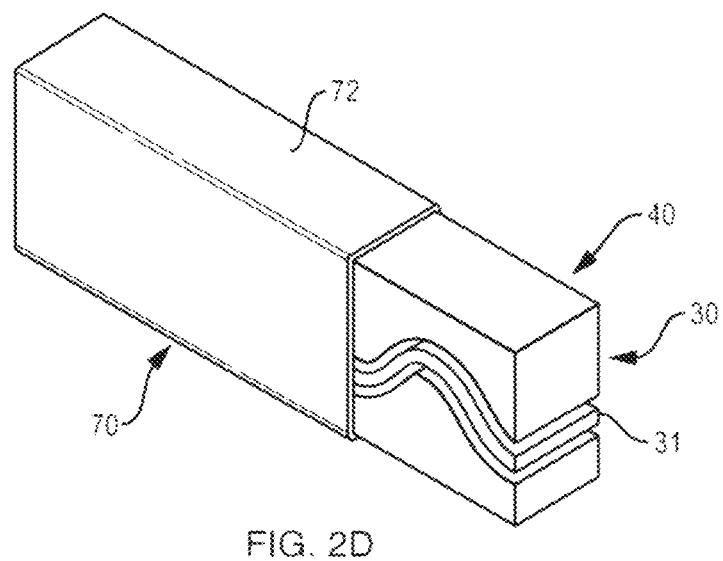
FIG. 2D illustrates a portion of a flexible arm that is partially depicted in FIGS. 2A-2C.

In some examples herein an over-mold encircles the flexible material that encases the flexible printed circuit along at least most of the original resting length of the flexible arm. For example flexible arm portion 70, FIG. 2D, includes over-mold 72 that fully covers most or all of flexible material 40. FIG. 2D illustrates more of the flexible arm that is partially depicted in FIGS. 2A-2C. In an example over-mold 72 is a silicone material. Over-mold 72 also helps to increase the environmental stability of the flexible arm by sealing openings between portions 42 and 44 and/or the ends of material 40 while retaining the flexibility of the arm.

Figure 3:
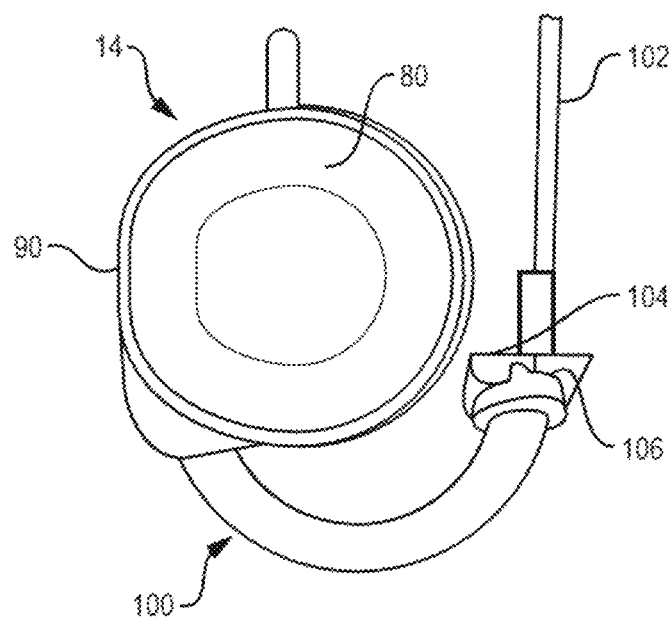
FIG. 3 illustrates a partially assembled open-ear headphone with a flexible arm.

FIG. 3 illustrates a partially assembled open-ear headphone with a flexible arm 100. Arm 100 is connected to housing member 80 of battery housing 14. Over-mold 90 comprises the outer layer of arm 100 and also covers some or all of member 80 and so also defines the outer layer of some or all of battery housing 14. Over-mold 90 can be accomplished using an insert molding technique. Enlarged overmolding end 106 represents a part of the over-molding that would overlie or abut the acoustic module, not shown in this view. Also shown in this view is enlarged end 104 of an arm internal member that functions to help mechanically couple arm 100 to the acoustic module and also provide stress relief for flexible printed circuit 102. Flexible printed circuit 102 passes through the entire length of arm 100, is terminated in battery housing 14 and would also be terminated in the acoustic module. In some examples and as further described below the flexible printed circuit stress relief member defines an opening through which flexible printed circuit 102 is threaded. Also, in some examples and as further described below, the flexible printed circuit defines an open slot along a portion of its length in the flexible arm, to accommodate twisting of the flexible printed circuit about its length.

Figure 4:
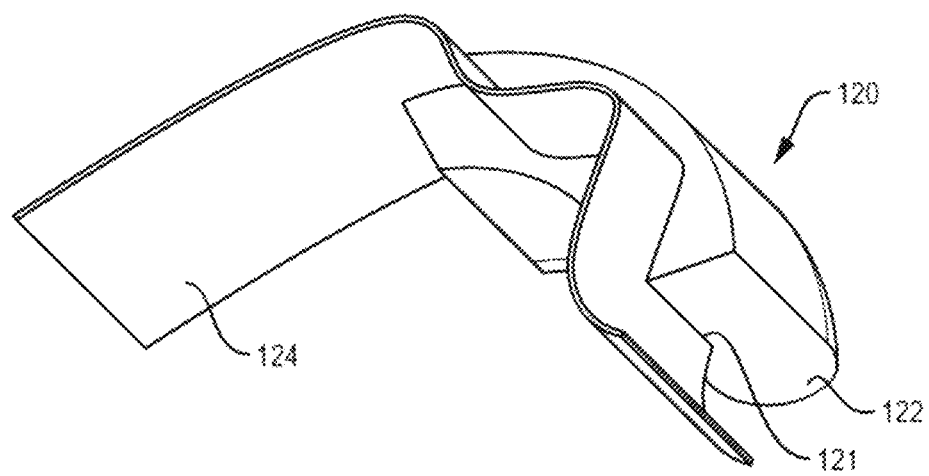
FIG. 4 illustrates a flexible printed circuit partially encased in a flexible material for a flexible arm.

FIG. 4 illustrates an alternative assembly 120 for a flexible arm. In some examples assembly 120 is an alternative to portion 30 illustrated in FIGS. 2A-2C. Assembly 120 includes a flexible printed circuit 124 partially encased in a flexible material 122. This is an alternative to sandwiching the flexible printed circuit between two discrete flexible members as in FIG. 2A. In assembly 120 flexible printed circuit 124 is seated within pre-formed serpentine recess 121 in a single flexible member 122. This illustrates one non-limiting manner of maintaining a flexible printed circuit length in the flexible arm that is longer than the original resting length of the arm. In some examples flexible material 122 is molded from a silicone material, or a different elastomer. Material 122 is molded with an internal slot 121 that is created using a removable insert. Flexible printed circuit 124 is then placed into slot 121 as shown. Material 122 thus fixes flexible printed circuit 124 in the configuration of slot 121. Slot 121 defines one or more curves along its length, such that it is longer than is a central longitudinal axis of the material 122. When assembly 120 is used in a flexible arm, the flexible printed circuit in the arm is longer than the original resting length of the arm.

Figure 5A:
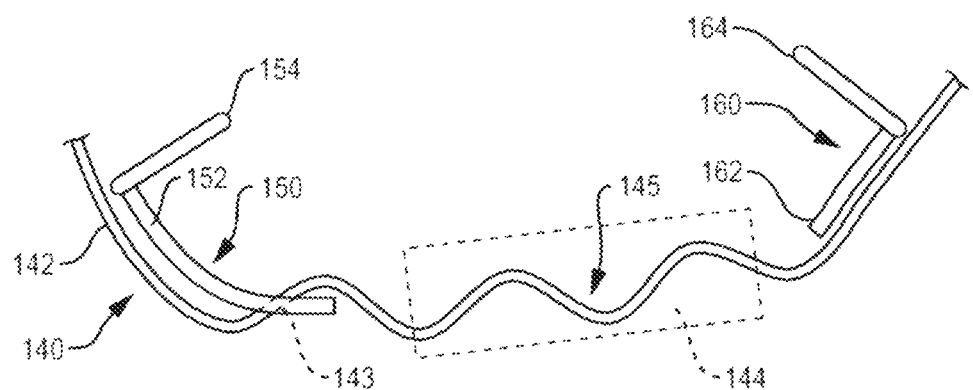
FIG. 5A is a schematic illustration of aspects of a flexible arm.

FIG. 5A is a schematic illustration of aspects 140 of a flexible arm. Flexible printed circuit 142 passes through the entire length of the arm. Portion 145 of flexible printed circuit 142 has a number of simple open curves that are held in place by flexible material 144 that encases at least some of flexible printed circuit 142. Members 150 and 160 are located at the ends of arm 140 and each act as both stress relief members of the flexible printed circuit and to mechanically couple the arm to the battery housing and the acoustic module (neither shown in this drawing). In some examples members 150 and 160 are made of an engineered plastic such as a nylon or acrylonitrile butadiene styrene (ABS) and act to reinforce the arm and strengthen it at its distal locations that are coupled to the battery housing and the acoustic module.

Figure 5B:
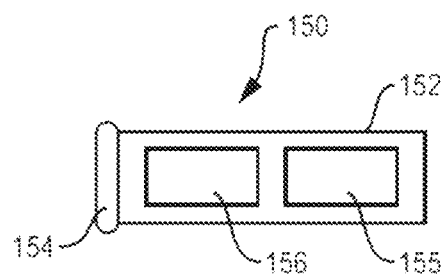
FIG. 5B illustrates a stress-relief member of the flexible arm of FIG. 5A.

Member 150 is also illustrated in FIG. 5B. It can be made by injection molding or machining or stamping. In some examples it is a unitary member. Member 150 includes body 152 with one or both of openings 155 and 156, and enlarged end 154 that is configured to be mechanically coupled to one of the battery housing and the acoustic module such as by an interference fit and/or by an adhesive. As shown in FIG. 5A, in some examples flexible printed circuit 142 passes through one of openings 155 and 156, which helps to provide stress relief. In some examples the arm is completed by overmolding with a flexible material which encases all or substantially all of aspects 140. The over-molding will fill or at least substantially fill openings 155 and 156, thus anchoring member 150 in the arm. In some examples second member 160 includes one or more openings (not shown) that are also filled with the over-molded material. In some examples member 160 acts as a guide for flexible printed circuit 142, which can pass over the back of member 160 as shown in FIG. 5A. Member 160 also includes enlarged end 164 that is configured to be mechanically coupled to one of the battery housing and the acoustic module such as by an interference fit and/or by an adhesive.

Figure 6:
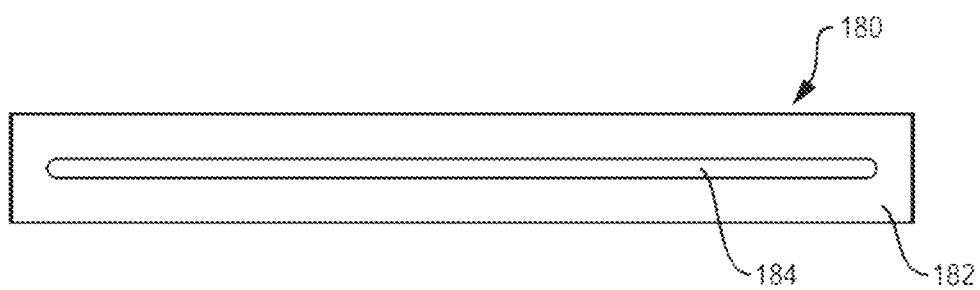
FIG. 6 partially illustrates a flexible printed circuit for a flexible arm.

FIG. 6 partially illustrates a flexible printed circuit assembly 180 for a flexible arm. Assembly 180 includes flexible printed circuit 182. In order to accommodate twisting of the arm about its longitudinal axis with less disruption to flexible printed circuit 182, flexible printed circuit 182 has an open slot 184 along a portion of its length. If flexible printed circuit 182 is twisted, the stress will at least in part be relieved by open slot 184. This may result in less stress on any metal conductors of flexible printed circuit 182, which may increase the useful life of the conductors.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A flexible arm that is configured to be located between and physically and electrically connect an acoustic module of an open-ear headphone to a battery housing of the open-ear headphone, wherein the flexible arm defines an original resting length and position between the acoustic module and the battery housing, the flexible arm comprising:

a flexible printed circuit that extends through the entire original resting length of the flexible arm and comprises a conductor that is configured to carry electrical energy between the acoustic module and the battery housing; and a flexible material that encases at least some of the flexible printed circuit;

wherein a length of the flexible printed circuit within the flexible arm is greater than the original resting length of the flexible arm, such that the flexible printed circuit can better accommodate tension or compression on the flexible arm as the flexible arm is bent from its original resting position.

2. The flexible arm of claim 1 wherein the flexible printed circuit defines one or more open curves along its length within the flexible arm.

3. The flexible arm of claim 2 wherein the one or more open curves are simple open curves.

4. The flexible arm of claim 1 wherein the original resting position of the flexible arm lies along a curved axis.

5. The flexible arm of claim 4 wherein the flexible printed circuit defines at least one simple open curve along its length within the flexible arm.

6. The flexible arm of claim 5 wherein the flexible printed circuit defines a plurality of both simple open upward curves and simple open downward curves along its length within the flexible arm.

7. The flexible arm of claim 6 wherein each simple open downward curve of the flexible printed circuit is adjacent to one more of the simple open upward curves.

8. The flexible arm of claim 4 wherein the curved axis defines a simple open curve.

9. The flexible arm of claim 8 wherein the curved axis is generally "C"-shaped.

10. The flexible arm of claim 4 wherein the curved axis bisects the flexible arm, and wherein different parts of a first surface of the flexible printed circuit lie on different sides of the curved axis.

11. The flexible arm of claim 1 wherein the flexible material comprises two mating members that each define a series of simple open curves along the original resting length of the flexible arm.

12. The flexible arm of claim 11 wherein the simple open curves of the two mating members are complimentary.

13. The flexible arm of claim 12 wherein the two mating members each define a wave-shaped mating surface wherein convex portions of one member are aligned with and fit into concave portions of the other member, and wherein the flexible printed circuit is located between the mating surfaces of the two mating members.

14. The flexible arm of claim 1 further comprising an over-mold that encircles the flexible material along at least most of the original resting length of the flexible arm.

15. The flexible arm of claim 14 wherein the over-mold further covers at least some of the battery housing.

16. The flexible arm of claim 1 further comprising a flexible printed circuit stress relief member proximate the flexible material, wherein the stress relief member defines an opening through which the flexible printed circuit is threaded.

17. The flexible arm of claim 1 wherein the flexible printed circuit defines an open slot along a portion of its length in the flexible arm, to accommodate twisting of the flexible printed circuit about its length.

18. A flexible arm that is configured to be located between and physically and electrically connect an acoustic module of an open-ear headphone to a battery housing of the open-ear headphone, wherein the flexible arm defines an original resting length and position between the acoustic module and the battery housing, wherein the original resting position of the flexible arm lies along a generally "C"-shaped curved axis, the flexible arm comprising:
   a flexible printed circuit that extends through the entire original resting length of the flexible arm and comprises a conductor that is configured to carry electrical energy between the acoustic module and the battery housing; and
   a flexible material that encases at least some of the flexible printed circuit;
   wherein the flexible printed circuit defines at least one simple open curve along a length of the flexible printed circuit within the flexible arm, such that its length within the flexible arm is greater than the original resting length of the flexible arm, such that the flexible printed circuit can better accommodate tension or compression on the flexible arm as the flexible arm is bent from its original resting position.

19. The flexible arm of claim 18 wherein the flexible printed circuit defines a plurality of both simple open upward curves and simple open downward curves along its length within the flexible arm, wherein each simple open downward curve of the flexible printed circuit is adjacent to a simple open upward curve.

20. The flexible arm of claim 19 further comprising a flexible printed circuit stress relief member proximate the flexible material, wherein the stress relief member defines an opening through which the flexible printed circuit is threaded.

* * * * *